US007443658B2

(12) United States Patent

Nagata et al.

(10) Patent No.: US 7,443,658 B2

(45) Date of Patent: Oct. 28, 2008

(54) INSPECTION APPARATUS FOR INSPECTING A DISPLAY MODULE

(75) Inventors: Katsunori Nagata, Yamatokoriyama (JP); Tsukasa Nakaoka, Suzuka (JP); Kentaro Uekane, Nara (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 450 days.

(21) Appl. No.: 10/896,172

(22) Filed: Jul. 22, 2004

(65) Prior Publication Data

US 2005/0019060 A1 Jan. 27, 2005

(30) Foreign Application Priority Data

Jul. 24, 2003 (JP) ............................ 2003-201017

(51) Int. Cl.
*H05K 7/00* (2006.01)

(52) U.S. Cl. ....................... 361/681; 361/686; 700/110; 345/156

(58) Field of Classification Search ................. 399/111; 361/601, 614, 679, 681, 686; 356/73.1; 345/156; 324/522; 700/109, 110
See application file for complete search history.

(56) References Cited

U.S. PATENT DOCUMENTS 6,226,176 B1 * 5/2001 Horie et al. ................. 361/686
2002/0064036 A1 * 5/2002 Yano et al. .................. 361/809
2003/0094778 A1 * 5/2003 Hungerbuhler ........ 280/47.131
2003/0141422 A1 * 7/2003 Lee et al. ................. 248/176.3

FOREIGN PATENT DOCUMENTS

JP 404244930 A * 9/1992 ................ 346/73.1
JP 08-043252 A 2/1996
JP 2002-005977 A 1/2002
JP 2002-108240 A 4/2002
KR 1998-025896 8/1998
KR 2002083197 A * 11/2002

* cited by examiner

*Primary Examiner*—Amr Awad
*Assistant Examiner*—Dennis P Joseph
(74) *Attorney, Agent, or Firm*—Birch, Stewart, Kolasch & Birch, LLP

(57) ABSTRACT

For inspecting a display module an inspection device is provided. There is a first connection having inputs for providing electric power and various signals needed to drive a display device. The display module can be mounted on the inspection device. There is a power supply for generating the electric power, a control circuit for generating the various signals, and a second connector having outputs of the power supply and the control circuit. When the display module is mounted on the inspection device, the first and second connectors are connected together, so the power supply and the control circuit can be electrically connected to the display module.

8 Claims, 7 Drawing Sheets

INSPECTION APPARATUS FOR INSPECTING A DISPLAY MODULE

This nonprovisional application claims priority under 35 U.S.C. § 119(*a*) on Patent Application No. 2003-201017 filed in Japan on Jul. 24, 2003, the entire contents of which are hereby incorporated by reference.

BACKGROUND OF THE INVENTION

1. Field of the Invention

The present invention relates to an inspection apparatus used to inspect a display module.

2. Description of Related Art

An example of a conventional inspection apparatus used for visual inspection of a display module is proposed, for example, in Japanese Patent Application Laid-Open No. 2002-108240. This inspection apparatus is built as a housing rack composed of shelves for supporting display modules in a multiple stages; angle adjustment rods for adjusting the inclination angles of those shelves; workbenches for laying display modules on with the rear faces thereof facing upward for the purpose of wiring power and signal cables therefor; and other components.

In this conventional housing rack, the shelves and the angle adjustment rods can be moved in the front-rear direction. This permits the housing rack to cope with display modules of varying size, i.e., from small-size to large-size display modules.

However, the conventional housing rack causes the following inconvenience. In a process preceding visual inspection, with a display module laid on a workbench with the rear face of the display module facing upward, many power and signal cables extending from an operation control panel provided on the part of the housing rack need to be wired manually, one by one, to connectors and the like provided on the rear face of the display module. This results in poor workability, and thus makes improvement in manufacturing efficiency infeasible.

SUMMARY OF THE INVENTION

In view of the conventionally experienced inconvenience mentioned above, the present invention provides an inspection apparatus for inspecting a display module with which inspection apparatus, when a display module is mounted thereon, the display module is readily connected electrically to a power source and control circuitry, and thus with improved workability.

The present invention provides an inspection apparatus for inspecting a display module having, in an outer edge portion thereof, a first connector having input terminals for inputting electric power and various signals needed to drive a display device has: a stage on which the display module is mounted; a power supply for generating the electric power; a control circuit for generating the various signals; and a second connector having output terminals of the power supply and the control circuit. Here, when the display module is mounted on the stage, the first and second connectors are connected together.

With this construction, when the display module is mounted on the stage, the first and second connectors are connected together. This brings the input terminals and the output terminals into contact with each other, and thereby permits the power supply and the control circuit of the inspection apparatus to be electrically connected to the display module. By feeding electric signals and various signals from the inspection apparatus to the display module, it is possible to drive the display module to perform visual inspection of the display surface thereof.

Specifically, the stage has a pair of stoppers for holding the display module by sandwiching the display module from the left-hand and right-hand side edges thereof, and the second connector is provided on one of those stoppers. This permits the display module to be held upright when mounted on the stage, and also ensures connection between the first and second connectors.

Furthermore, a boss-and-hole engagement mechanism is provided between the first and second connectors. Thus, at the same time that the display module is mounted, the first and second connectors are appropriately positions relative to each other, bringing the input terminals and the output terminals into stable contact with each other.

Advisably, the inspection apparatus is built as a movable handcart. This makes the inspection apparatus easy to move and thus more usable.

DETAILED DESCRIPTION OF THE INVENTION

Hereinafter, an embodiment of the present invention will be described with reference to the accompanying drawings. The embodiment described below deals with an example in which an inspection apparatus for inspecting a display module is realized in the form of a transportable handcart. It should be understood, however, that the present invention is applicable to an inspection apparatus constructed in any other manner than specifically described below so long as it is of the type that is connected to a display module to control it; for example, an inspection apparatus according to the present invention may be realized in the form of, instead of a transportable handcart, a housing rack.

Figure 1:
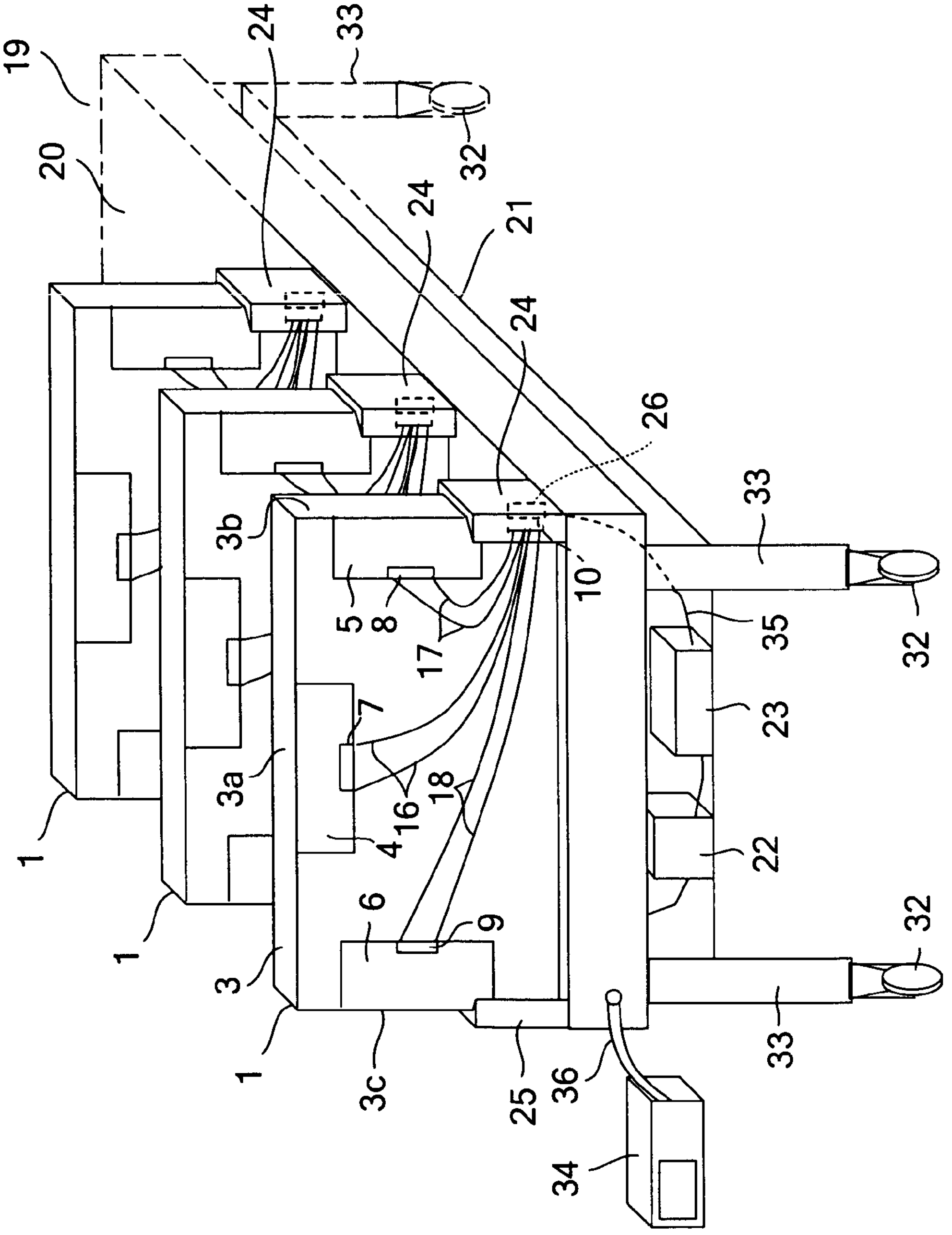
FIG. 1 is a perspective view showing a state in which display modules are mounted on an inspection handcart.
Figure 2A:
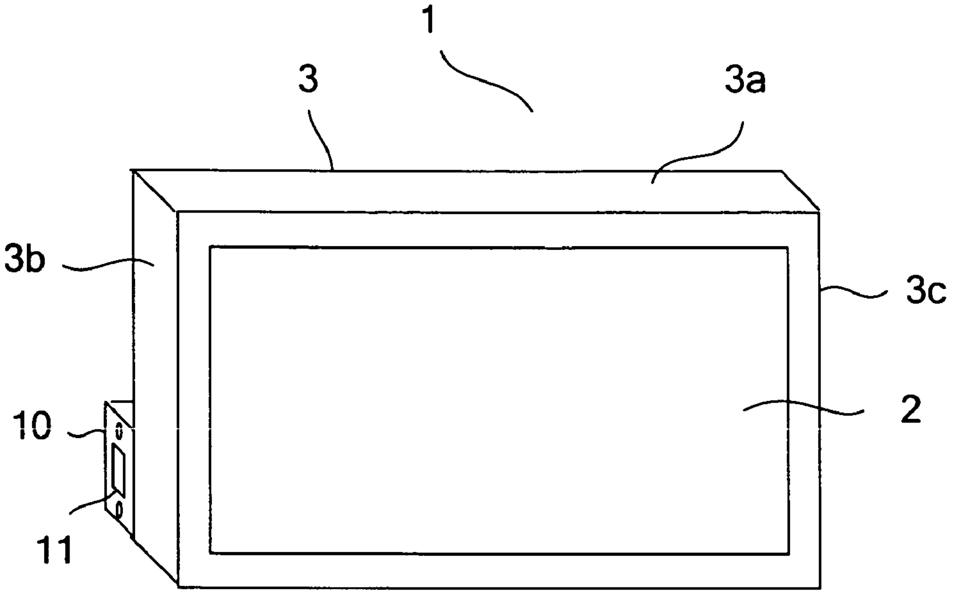
FIG. 2A is a perspective front view of the display module.
Figure 2B:
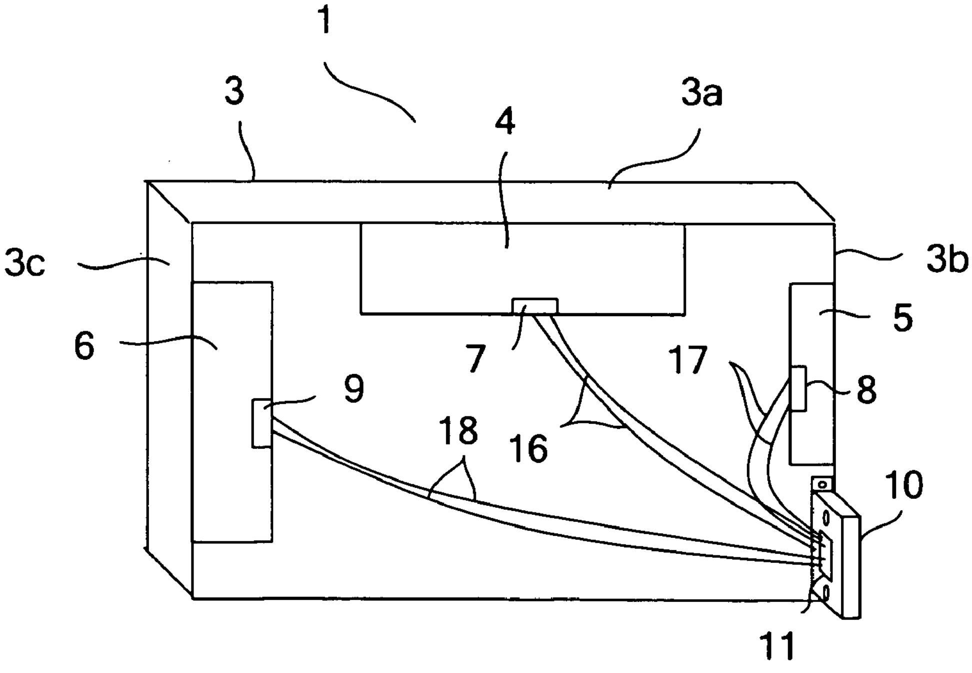
FIG. 2B is a perspective rear view of the display module.

FIG. 1 is a perspective view showing a state in which display modules are mounted on an inspection handcart. FIG. 2A is a perspective front view of the display module, and FIG. 2B is a perspective rear view of the display module. As shown in FIG. 2A, the display module 1 includes: an active matrix liquid crystal panel (display device) 2 having a color filter substrate laid on top of a TFT (thin-film transistor) substrate with a liquid crystal layer sandwiched therebetween; and a box-shaped casing 3 that supports the liquid crystal panel 2 in such a way that the display surface of the liquid crystal panel 2 is exposed out through a frame member. As shown in FIG. 2B, on the rear face of the casing 3, there are provided (as seen from the front face of the display module 1) a control circuit board 4 in a upper edge 3*a* portion of the casing 3, a converter circuit board 5 in a left-hand edge 3*b* portion of the casing 3, and a converter circuit board 6 in a right-hand edge 3*c* portion of the casing 3.

The control circuit board 4 and the converter circuit boards 5 and 6 receive electric power and various signals via input terminals 7, 8, and 9 provided respectively in portions thereof facing the interior of the casing 3. In a lower end portion of the left-hand edge 3*b* portion on the rear face of the casing 3, there is fitted a first connector 10 accompanied by connection cables 16 to 18.

Figure 4A:
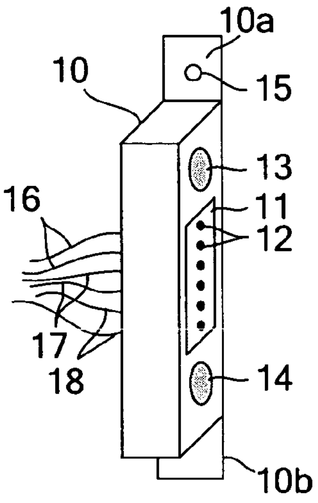
FIG. 4A is a perspective view of the first connector.
Figure 4B:
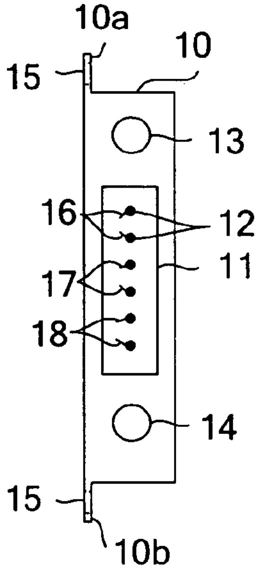
FIG. 4B is a left-hand side view of the first connector.
Figure 4C:
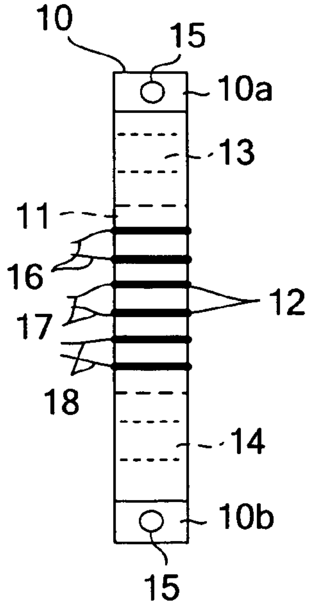
FIG. 4C is a front sectional view of the first connector.
Figure 4D:
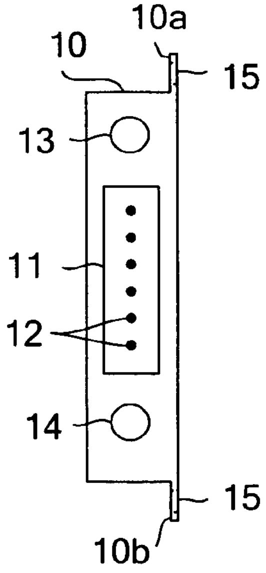
FIG. 4D is a right-hand side view of the first connector.
Figure 6:
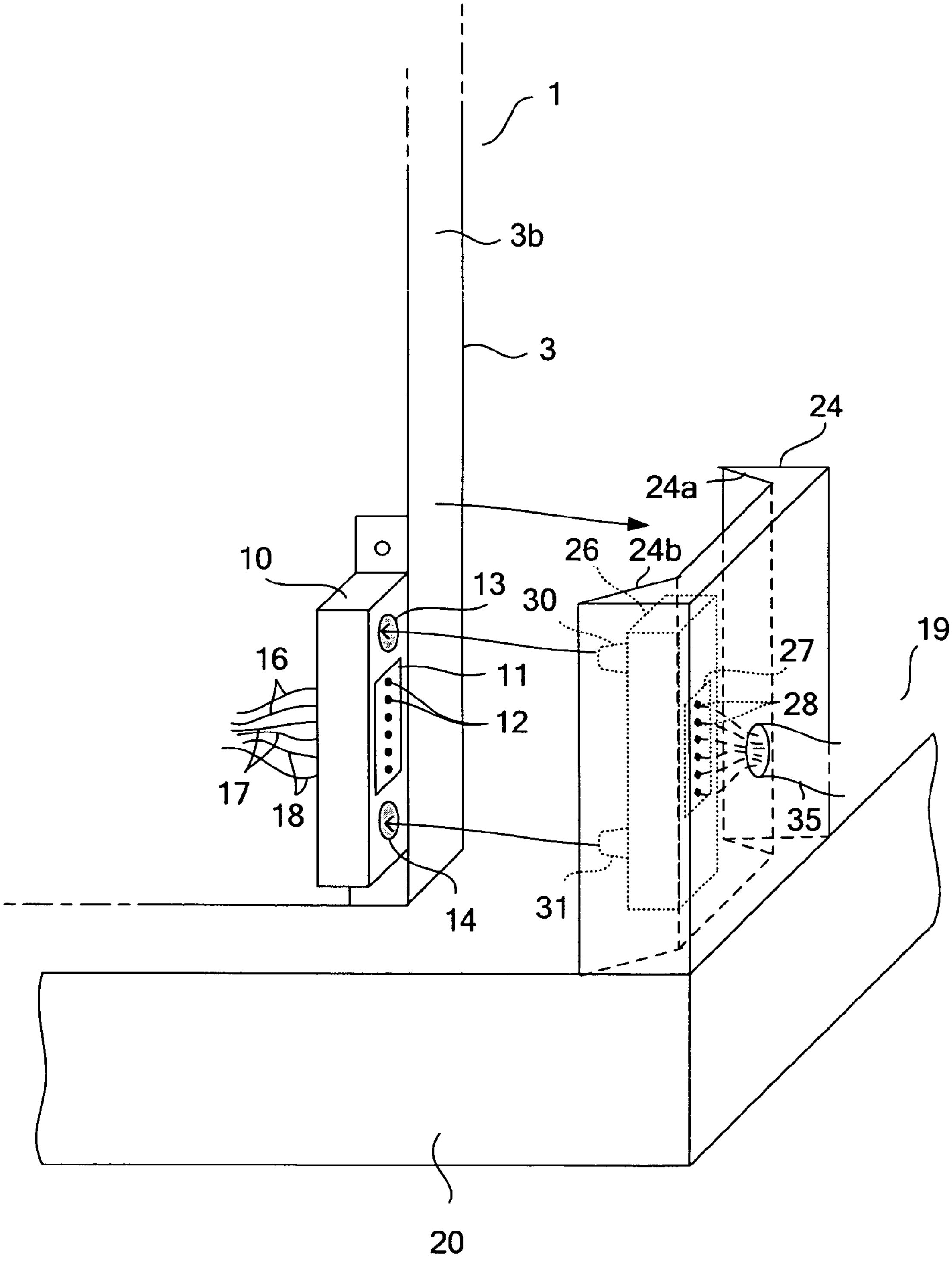
FIG. 6 is an enlarged perspective view of a principal portion of the inspection apparatus when a display module is mounted thereon.

FIG. 4A is a perspective view of the first connector, FIG. 4B is a left-hand side view of the first connector, FIG. 4C is a front sectional view of the first connector, and FIG. 4D is a right-hand side view of the first connector. As shown in these figures, the first connector 10 is a rectangular member, and has, at the upper and lower ends thereof, flanges 10*a* and 10*b* having screw holes 15 formed therein. With screws put through these screw holes 15, the first connector 10 is fastened to the casing 3 (see FIG. 2B). As shown in FIG. 6, this first connector 10 forms a pair with a second connector 26 provided on the part of the inspection cart 19. The first connector 10 is fitted to the casing 3 in such a way that the surface at which the connectors make contact with each other is flush with the left-hand edge 3*b* portion of the casing 3.

In a central portion of the first connector 10, there is buried a rectangular terminal member 11 so as to be flush with the left-hand and right-hand side faces of the first connector 10. Through the first connector 10, there are formed through holes, one above the terminal member 11 and another below it, so as to penetrate the first connector 10 from left to right. Through the terminal member 11, there are formed a plurality of input terminals 12 arranged in a vertical row. To one ends of these input terminals 12 are previously connected, as by soldering, one ends of the connection cables 16 to 18 for connecting the input terminals 12 to the terminals 7 of the control circuit board 4 and to the terminals 8 and 9 of the converter circuit boards 5 and 6.

As shown in FIG. 2B, the first connector 10 is fastened with screws in a predetermined position on the rear face of the casing 3. Then, the other end (free end) of the connection cable 16 is connected to the input terminals 7 of the control circuit board 4, and the other ends (free ends) of the connection cables 17 and 18 are connected to the input terminals 8 and 9 of the converter circuit boards 5 and 6. In this way, the input terminals 7 of the control circuit board 4 and the input terminals 8 and 9 of the converter circuit boards 5 and 6 are brought together on the first connector 10.

Next, the construction of the inspection cart 19 will be described with reference to FIG. 1. The inspection cart 19 includes a stage 20. From the four corners of the rear face of the stage 20, there extend legs 33 having, at the lower ends thereof, casters 32 that roll on the floor. Under the stage 20, there is provided a shelf 21, and on this shelf 21, there are provided a power supply 22 and a drive circuit 23 for generating various signals. On the stage 20, there are provided a plurality of pairs, arranged in a row, of stoppers 24 and 25. The stoppers 24 and 25 forming each pair are placed apart from each other by a distance corresponding to the left-to-right width of a display module 1 (i.e., the distance between the left-hand and right-side edges 3*b* and 3*c* of the casing 3), and serve to keep the display module 1 upright on the 20 by sandwiching it from the left-hand and right-hand sides thereof. Thus, as shown in FIG. 1, it is possible to mount a plurality of display modules 1 parallel to one another on the stage 20 and visually inspect them at the same time.

The stopper 24 is an unmovable member fixed in an edge portion of the stage 20, and the second connector 26 is provided on a surface of the stopper 24 facing the other stopper 25. By contrast, the stopper 25 is collapsible. That is, the stopper 25 is normally in a position in which it makes contact with the left-side face of the stage 20 and suspends therefrom; when the stopper 25 is lifted up to a position in which it stands on the stage 20, it is locked in that position.

Figure 7:
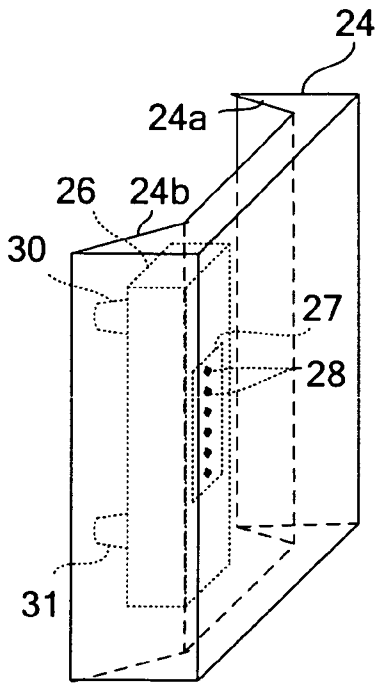
FIG. 7 is a perspective view of one stopper.
Figure 8:
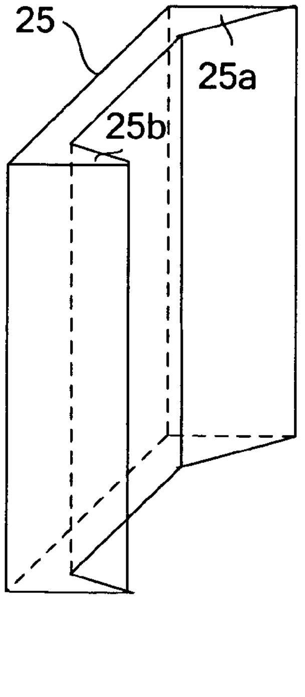
FIG. 8 is a perspective view of the other stopper.

FIG. 7 is a perspective view of the stopper 24, and FIG. 8 is a perspective view of the stopper 25. As shown in these figures, the stopper 24 (25) is a member having a pair of claws 24*a* and 24*b* (25*a* and 25*b*), each in the shape of a flat triangular prism, so as to have a C-shaped cross section as a whole. These claws 24*a* and 24*b* grip the left-hand edge 3*b* (right-hand edge 3*c*) portion of the casing 3 of the display module 1 so that the display module 1 is held unmovable.

Figure 5A:
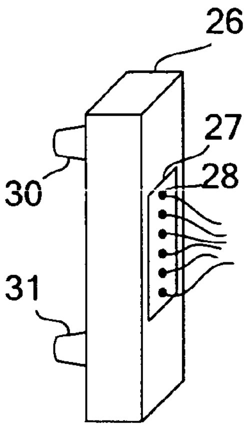
FIG. 5A is a perspective view of the second connector.
Figure 5B:
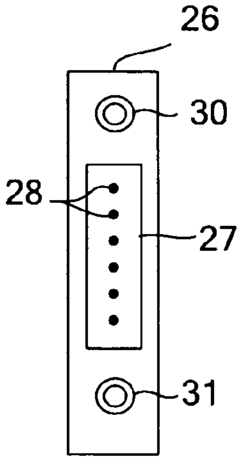
FIG. 5B is a left-hand side view of the second connector.
Figure 5C:
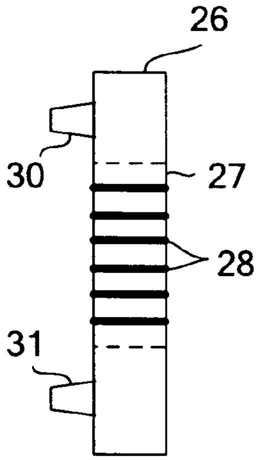
FIG. 5C is a front sectional view of the second connector.
Figure 5D:
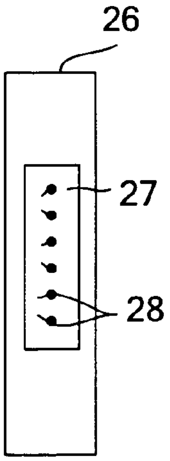
FIG. 5D is a right-hand side view of the second connector.

FIG. 5A is a perspective view of the second connector, FIG. 5B is a left-hand side view of the second connector, FIG. 5C is a front sectional view of the second connector, and FIG. 5D is a right-hand side view of the second connector. The second connector 26 is, like the first connector 10, a rectangular member. In a central portion of the second connector 26, there is provided a terminal member 27. On the left-hand side face of the second connector 26, there are provided bosses 30 and 31, one above the terminal member 27 and another below it, that engage with the through holes 13 and 14 (see FIG. 4A) of the first connector 10. Through the terminal member 27, there are formed a plurality of output terminals 28 arranged in a vertical row. To one ends of these output terminals 28 are connected, as by soldering, power leads and various signal leads bundled into a cable 35 (see FIG. 6). In this way, the output terminals (not illustrated) of the power supply 22 (see FIG. 1) and the drive circuit 23 (see FIG. 1) are brought together on the second connector 26.

Figure 3A:
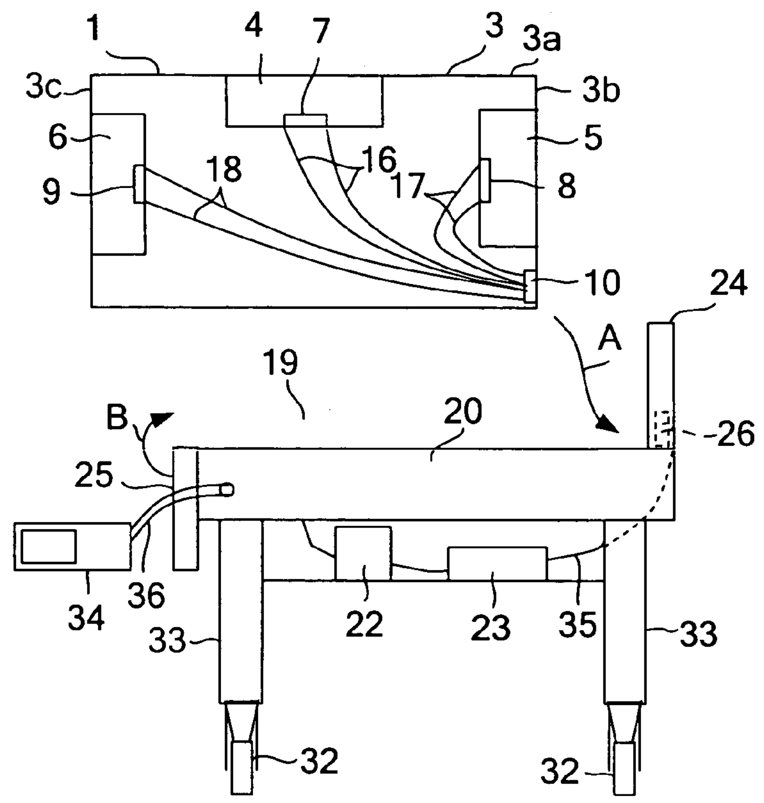
FIG. 3A is a plan view of the inspection handcart in a state before a display module is mounted thereon.
Figure 3B:
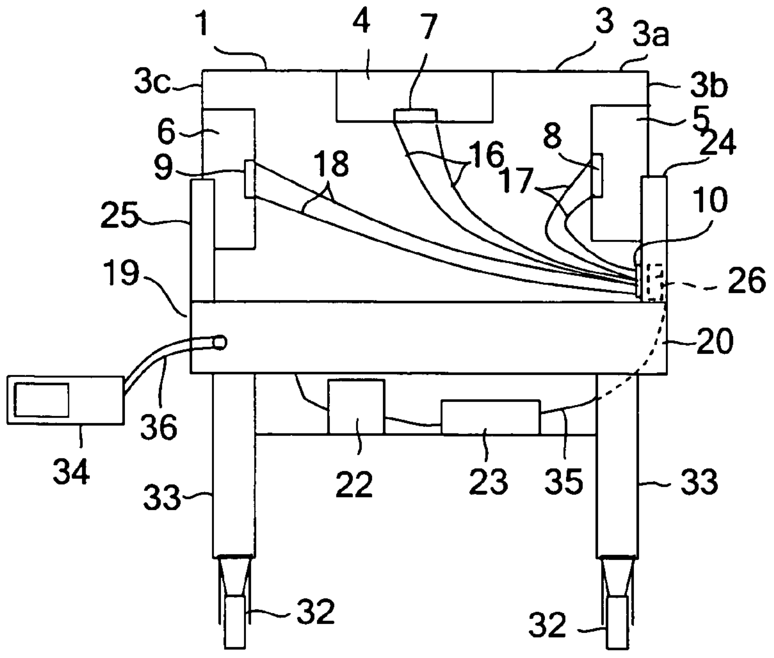
FIG. 3B is a plan view of the inspection handcart in a state after a display module is mounted thereon.

Now, with reference to FIGS. 3A and 3B, a description will be given of how to use the inspection handcart, constructed as described above, for inspecting a display module. FIG. 3A is a plan view of the inspection handcart in a state before a display module is mounted thereon, and FIG. 3B is a plan view of the inspection handcart in a state after a display module is mounted thereon. First, as indicated by arrow A in FIG. 3A, a display module 1 is so moved that, with a lower end portion of the left-hand edge 3*b* of the casing 3 put between the claws 24*a* and 24*b* (see FIG. 7), the display module makes contact with the stopper 24. Then, the display module 1 is held upright on the stage 20. Here, as shown in an enlarged perspective view in FIG. 6, the bosses 30 and 31 are engaged with the through holes 13 and 14.

Next, as indicated by arrow B in FIG. 3A, the stopper 25 is lifted up, and is locked with a lower end portion of the right-hand edge 3*c* of the casing 3 put between the claws 25*a* and 25*b* (see FIG. 8). Now, as shown in FIG. 3B, the left-hand and right-hand edges 3*b* and 3*c* of the casing 3 are held by the stoppers 24 and 25, and thus the display module 1 is securely mounted on the inspection cart 19, with the display module 1 standing upright on the stage 20 and with the first and second connectors 10 and 26 connected together. Moreover, between the connectors, the bosses 30 and 31 engage with the through holes 13 and 14 to achieve appropriate positioning. This permits the input terminals 12 and the output terminals 28 to be brought into stable contact with one another, and thus helps securely connect them together.

Next, by using an operation box 43 provided on the part of the inspection cart 19, electric power and various signals are fed via a cable 36 to the display module 1 to keep the display module 1 operating for a predetermined length of time for aging. During aging or before or after the end of aging, the state of display on the display surface of the liquid crystal panel 2 of the display module 1 is visually inspected. On completion of visual inspection, the stopper 25 is collapsed, and the display module 1 is removed from the stage 20.

As described above, the input terminals 7 to 9 of the control circuit board 4 and the converter circuit boards 5 and 6 provided on the part of the display module 1 are brought together on the first connector 10, and correspondingly the output terminals 28 of the power supply 22 and the drive circuit 23 provided on the part of the inspection cart 19 are brought together on the second connector. As a result, at the same time that the display module 1 is mounted on the inspection cart 19, their connectors are connected together. This saves the trouble of connecting cables, resulting in increased workability and thus increased manufacturing efficiency.

This embodiment deals with a case where a connector is provided in a side edge portion of the display module. It is, however, also possible to adopt any other construction so long as, at the same time that the display module is mounted on the inspection handcart, the first and second connectors are connected together. For example, it is possible to provide a first connector in a lower edge portion of the display module and a second connector on the surface of the stage on which the display module is mounted.

As described above, according to the present invention, the input terminals provided on the part of a display module to permit the display module to receive electric power and various signals with which the display module is driven are brought together on a first connector, and the output terminals provided on the part of an inspection apparatus to permit a power supply and a control circuit to feed out their outputs are brought together on a second connector. Thus, at the same time that the display module is mounted on the inspection apparatus, their connectors are connected together. This saves the trouble of connecting cables, resulting in increased workability and thus increased manufacturing efficiency. Moreover, between the connectors, a boss-and-hole engagement mechanism for positioning is provided. This helps bring the input and output terminals into stable contact with each other, and thus helps securely connect them together.

What is claimed is:

1. An inspection apparatus for inspecting a display module, comprising:

a stage;

wherein the stage has a pair of stoppers for removably securing the display module vertically for inspection by sandwiching the display module from left-hand and right-hand side edges thereof;

a stopper electrical connector is provided on one of the stoppers;

wherein the stopper electrical connector has electrical terminals that are capable of being operatively connected to electrical terminals on a display electrical connector on the display module; and wherein, when the display module is mounted between the stoppers, the stopper electrical connector and the display electrical connector are operably connected together.

2. The inspection apparatus of claim 1, wherein a boss-and-hole engagement mechanism is provided between the stopper electrical connector and the display electrical connector.

3. The inspection apparatus of claim 1, wherein the inspection apparatus is built as a movable handcart.

4. The inspection apparatus of claim 1, wherein the pair of stoppers, comprise a plurality of pairs of stoppers arranged in a row on the stage.

5. The inspection apparatus of claim 1, wherein the stopper electrical connector is capable of providing power and display control signals to the display electrical connector, and wherein the stoppers, the display electrical connector is capable of receiving power and display control signals from the stopper electrical connector.

6. The inspection apparatus of claim 5, wherein the display control signals are display test signals for testing the display.

7. The inspection apparatus of claim 1, wherein the power supply is attached to the stage.

8. The inspection apparatus of claim 1, wherein the stoppers are fixably spaced to the width of the display module.

* * * * *